United States Patent [19]
Hoeld

[11] Patent Number: 6,046,617
[45] Date of Patent: Apr. 4, 2000

[54] CMOS LEVEL DETECTION CIRCUIT WITH HYSTERESIS HAVING DISABLE/ENABLE FUNCTION AND METHOD

[75] Inventor: Wolfgang K. Hoeld, Moorenwels, Germany

[73] Assignee: National Semiconductor Corporation, Santa Clara, Calif.

[21] Appl. No.: 09/104,765

[22] Filed: Jun. 25, 1998

[51] Int. Cl.[7] .................................................. H03K 3/356
[52] U.S. Cl. ................................ 327/206; 327/94; 327/97
[58] Field of Search ..................................... 327/205, 206, 327/198, 73, 74, 76, 208, 210, 72, 91, 94, 97

[56] References Cited

U.S. PATENT DOCUMENTS

| | | | |
|---|---|---|---|
| 3,984,703 | 10/1976 | Jorgensen | 327/206 |
| 4,563,594 | 1/1986 | Koyama | 327/206 |
| 5,369,311 | 11/1994 | Wang et al. | 327/292 |
| 5,402,063 | 3/1995 | Kim | 324/158.1 |
| 5,450,019 | 9/1995 | McClure et al. | 326/28 |
| 5,489,866 | 2/1996 | Diba | 327/206 |
| 5,563,532 | 10/1996 | Wu et al. | 327/34 |
| 5,602,496 | 2/1997 | Mahmood | 326/71 |
| 5,696,719 | 12/1997 | Baek et al. | 365/189.05 |
| 5,886,556 | 3/1999 | Ganger et al. | 327/206 |

*Primary Examiner*—Timothy P. Callahan
*Assistant Examiner*—Terry L. Englund
*Attorney, Agent, or Firm*—Limbach & Limbach L.L.P.

[57] ABSTRACT

A level detection circuit, such as a Schmitt trigger circuit, has an input threshold voltage which varies depending upon the detection circuit output. The circuit includes a level detection stage, circuitry for switching the level detection stage between an active and a standby mode and a storage device for storing data indicative of the input threshold voltage when the level detection stage is in the standby mode and for controlling the level detection stage using the stored data so that the stage will retain the same input threshold voltage that existed when the level detection stage was switched to the standby mode.

17 Claims, 2 Drawing Sheets

CMOS LEVEL DETECTION CIRCUIT WITH HYSTERESIS HAVING DISABLE/ENABLE FUNCTION AND METHOD

BACKGROUND OF THE INVENTION

1. Field of the Invention

The present invention relates generally to buffer circuits having hysteresis such a Schmitt trigger circuits and, in particular, to buffer circuits which can be disabled and enabled while retaining the hysteresis characteristic that existed prior to disablement.

2. Description of Related Art

Level detection circuits having hysteresis, sometimes referred to as Schmitt trigger circuits, are commonly used as input circuits of integrated circuits for receiving signals external to the integrated circuit. Referring to the drawings, FIG. 1 is a schematic diagram of an exemplary level detection circuit, generally designated by the numeral 10. The circuit includes four MOS transistors connected in series, with the common gate connection forming the input to the circuit. Transistors 12 and 14 are P-type devices, with the source of transistor 12 connected to a voltage supply $V_{DD}$, typically +5 volts, and the source of transistor 14 connected to the drain of transistor 12.

The common drain connection of P-type transistor 14 and N-type transistor 16 functions as the circuit output. The source of transistor 16 is connected to the drain of N-type transistor 18, with the source of transistor 18 being connected to the circuit common ($V_{SS}$). The circuit output is connected to the common gates of a P-type transistor 20 and an N-type transistor 22. Transistor 20 has a drain connected to the circuit common and a source connected to the junction of transistors 12 and 14. Transistor 22 has a drain connected to supply $V_{DD}$ and a source connected to the junction of transistors 16 and 18.

FIG. 2 is a diagram showing an idealized transfer function characteristic curve 24 of the FIG. 1 circuit. The input threshold voltage of circuit 10, the point at which the input voltage Vin is equal to the output Vout voltage, is a function of the state of the output as can be seen from curve 24. The circuit threshold voltage is to be distinguished from the threshold voltage of the individual transistors, that being defined as the gate-source voltage necessary to cause the transistor to conduct some minimum current, such as 1 $\mu$A, for a particular drain-source voltage, such as 1 volt.

Assume, for example, that the circuit input Vin is at a low level near ground ($V_{SS}$) and is increased to a high level. Also assume that the output Vout is at a high level approaching $V_{DD}$. At this point, N-type transistors 16 and 18 will be off and N-type transistor 22 will be on, but will not be conducting current. Further, the P-type transistors 12 and 14 will be on and P-type transistor 20 will be off.

As the input Vin increases in voltage, the gate-source voltage of transistor 18 will increase until the threshold voltage of the transistor $V_{TN18}$ is reached at which point current from transistor 22 will start to flow through transistor 18. The source voltage of transistor 16 will thus increase due to transistor 22 thereby tending to increase the effective turn on point of transistor 16. Arrow 26A of FIG. 2 indicates that portion of the transfer function curve 24 that pertains to these conditions once Vin has reached a first threshold voltage Vin of the circuit.

Eventually, the input voltage Vin will be equal to the drain-source voltage of transistor 18 plus the gate-source threshold voltage of transistor 16 ($V_{TN16}$) so that transistor 16 will proceed to turn on. This point is the second threshold voltage Vin$^+$ of the circuit. At the same time, transistors 12 and 14 will start to turn off. Transistor 22 will also begin to turn off and transistor 20 will begin to turn on. Transistors 20 and 22 provide positive feedback which will increase the rate at which the circuit 10 changes state. As indicated by arrow 26B, the output Vout will then drop to ground potential ($V_{SS}$).

When output Vout is low, transistor 20 will be on but will not be conducting current because transistors 12 and 14 will be off. Should Vin begin to drop, the voltage will eventually reach the second threshold voltage Vin$^+$. However, since transistor 22 is not conducting, the overall threshold voltage of the circuit will be lower so that transistors 16 and 18 will continue to remain conductive. As Vin is reduced further, Vin will be equal to the sum of the drain-source voltage dropped across transistor 20 plus the gate-source threshold voltage $V_{TP14}$ of transistor 14. Vin will then be at the first threshold voltage Vin$^-$ and transistor 14 will proceed to turn on together with transistor 12. As indicted by arrow 26D of FIG. 2, the output voltage Vout will switch back to the high state ($V_{DD}$). One of the properties of the Schmitt trigger circuit 10 is increased immunity to noise on the input Vin. By way of example, when input Vin has increased just to the point Vin$^+$ so that the output has changed to a low state ($V_{DD}$), noise on the input may cause Vin to momentarily drop back below Vin$^+$. However, due to the hysteresis effect provided by transistor 20, the threshold voltage of the circuit will have dropped to Vin$^-$ so that there will be no change in output Vout unless the noise is sufficiently great to cause the input to drop even further to Vin$^-$.

In many applications, it is necessary to switch an integrated circuit to a low power or standby mode of operation to conserve power. This technique is sometimes used when several integrated circuits are connected to receive a group of input signals from an external source, with only one of the circuits being active at any time and with the remaining circuits being in a standby mode. Input buffer circuits of such integrated circuits must be powered down in this mode of operation to prevent the circuits from drawing DC and AC switching currents, particularly due to changes in the external inputs. The most common method of powering down such interface circuits is to disconnect the circuit from the power source. If this approach were used for the level detection circuit 10, the circuit will come up in an indeterminate state when power is reapplied. Thus, the input threshold voltage could be either Vin$^-$ or Vin$^+$ independent of the state of the circuit when power was removed. This can result in improper operation when the circuit is first accessed after power has been reapplied.

The present invention overcomes the above-described limitations of conventional level detection circuits having hysteresis. Reliable level detection with hysteresis is provided by the circuit even after the circuit has been placed in a low power mode of operation. These and other advantages of the present invention will become apparent to those skilled in the art upon a reading of the following Detailed Description of the Invention together with the drawings.

SUMMARY OF THE INVENTION

A level detection circuit, such as a Schmitt trigger circuit, capable of being switched between an active mode and a standby mode while retaining a desired input threshold voltage after being switched from the standby mode to the active mode is disclosed. The level detection circuit includes a level detection stage, enable circuitry and a storage device.

The level detection stage has an input for receiving an input signal and a first input threshold voltage when the output is at a first state and a second input voltage when the input is at a second state. For a typical inverting level detection stage, a high state output will result in a relatively high input threshold voltage and a low state output will result in a relatively low input threshold voltage.

The enable circuitry responds to an enable signal and operates to provide a current path through the level detection stage when the circuit is in the active mode and to interrupt the current path when the circuit is in the standby mode. The storage device operates to store a value indicative of the state of the level detection output so that the state can be restored when the level detection stage changes from the standby mode back to the active mode. Thus, the same input threshold values that existed just prior to entry into the standby mode will be present when the circuit exits the standby mode thereby ensuring reliable error free operation of the level detection circuit.

DETAILED DESCRIPTION OF THE INVENTION

Figure 3:
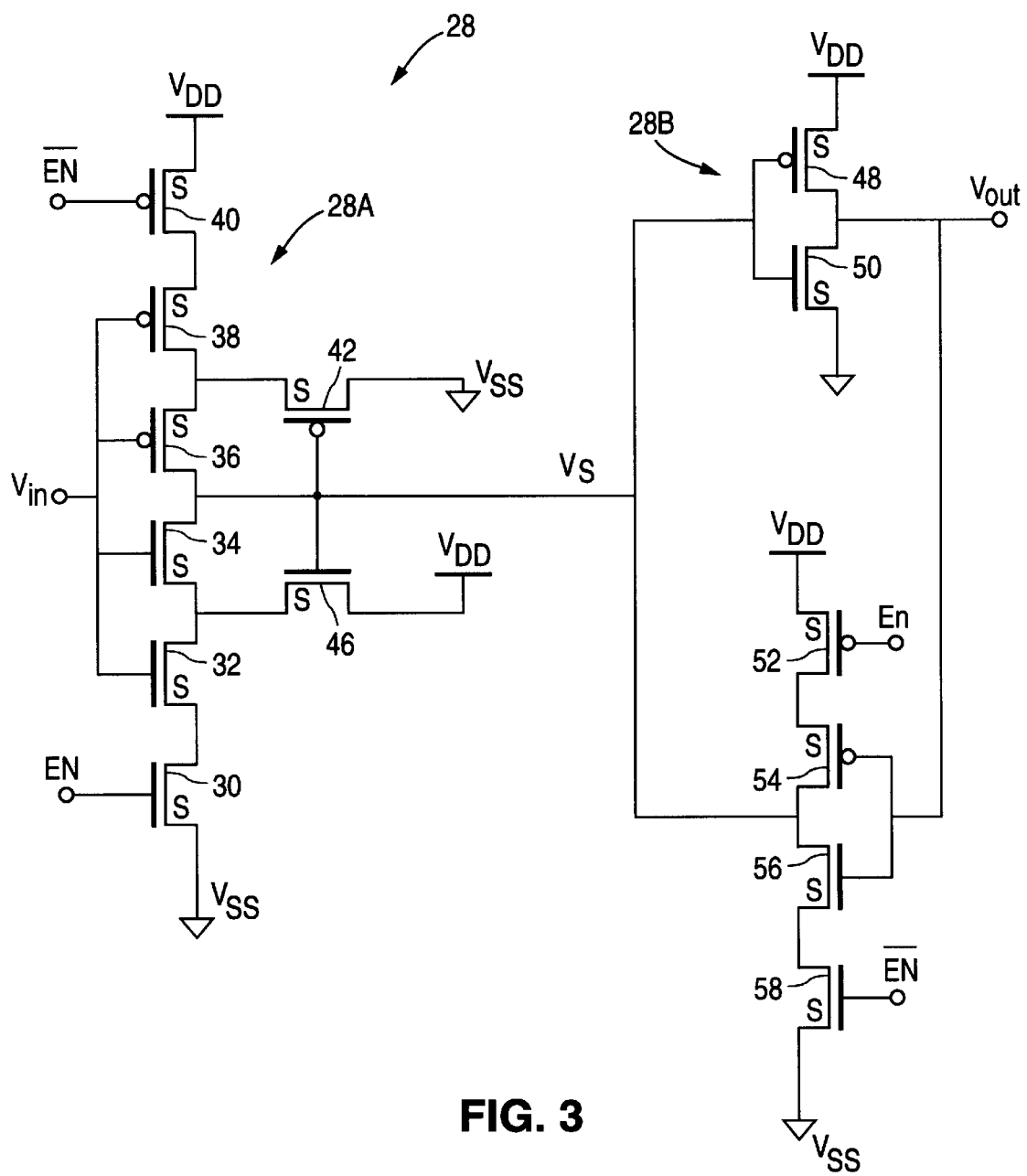
FIG. 3 is a schematic diagram of a level detection circuit in accordance with the present invention.

Referring again to the drawing, FIG. 3 is a schematic diagram of a level detection circuit 28 in accordance with the present invention. The circuit includes an input stage 28A or level detection stage followed by a latch stage 28B. The input stage includes three N-type transistors 30, 32 and 34 connected in series with three P-type transistors 36, 38 and 40. The common gate connection of transistors 32, 34, 36 and 38 form the input of the level detection circuit 28 which receives input Vin.

The output $V_S$ of the input stage is at the common drain connection of transistors 34 and 36. A P-type transistor 42 has a gate connected to the output $V_S$, a source connected to the junction of transistors 36 and 38 and a drain connected to ground ($V_{SS}$). An N-type transistor 46 has a gate connected to the output $V_S$, a drain connected to supply $V_{DD}$ and a source connected to the junction of transistors 32 and 34. An N-type transistor 30 is connected between the circuit common $V_{SS}$ and transistor 32 and has a gate which receives an enable signal EN. A P-type transistor 40 is connected between transistor 38 and supply voltage $V_{DD}$ and has a gate which receives the enable signal complement $\overline{EN}$.

The output $V_S$ of the input stage 28A is forwarded to the input of the latch stage 28B. The latch stage includes an inverter circuit comprised of transistors 48 and 50, the common gates of which form the latch stage input which receives $V_S$. The common drain connection of transistors 48 and 50 is the output of the level detector circuit 28 where Vout is produced.

The latch stage 28B further includes a feedback inverter circuit comprised of P-type transistors 52 and 54 and N-type transistors 56 and 58 connected in series. The common gate connection of transistors 54 and 56 form the inverter input which is connected to the output of the level detector circuit Vout. The output of the inverter, the common drain connection of transistors 54 and 56, is connected to the input of the first inverter and to the output of the level detector stage 28A. A P-type transistor 52 is connected in series between transistor 54 and supply $V_{DD}$ and an N-type transistor is connected between transistor 56 and the circuit common $V_{SS}$. The gate of transistor 52 receives enable signal EN and the gate of transistor 58 receives the inverter enable signal $\overline{EN}$.

Figure 1:
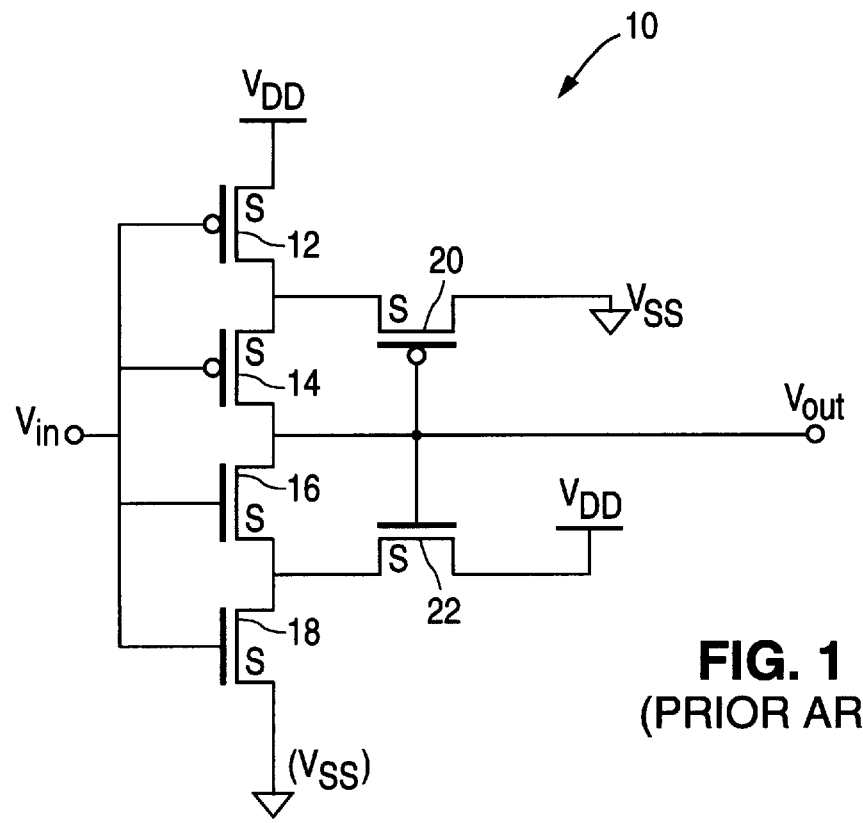
FIG. 1 is a schematic diagram of a conventional level detection circuit having hysteresis.
Figure 2:
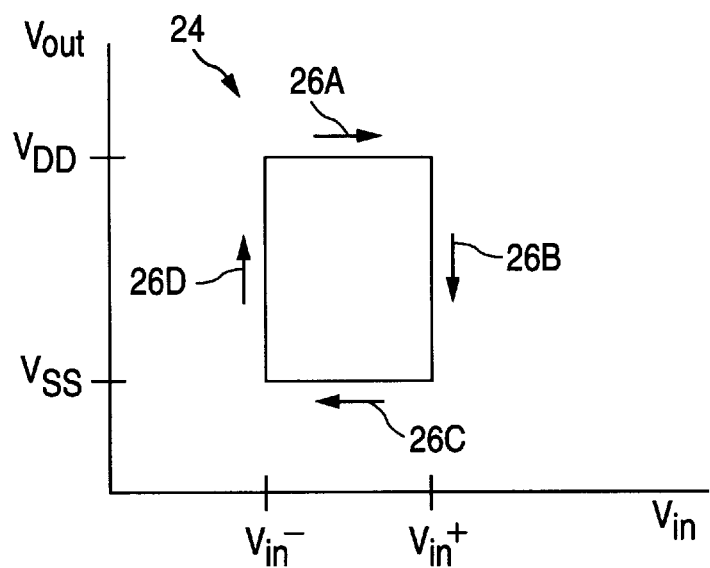
FIG. 2 is a transfer characteristic curve for the circuit of FIG. 1.

When the level detection circuit 28 is to be placed in the active mode, the enable signal EN is active (high), signal $\overline{EN}$ will be low so that transistors 30 and 40 are both turned on. Thus, the sources of transistors 38 and 32 will essentially be connected to $V_{DD}$ and $V_{SS}$, respectively. In that case, the input circuit 28A operates as a level detector in the same manner as conventional circuit 10 of FIG. 1 and will have a transfer characteristic similar to that depicted in FIG. 2. In particular, hysteresis will be provided by virtue of the influence provided by feedback transistors 42 and 46 on the gate-source voltage of transistors 36 and 34. The first inverter comprising transistors 48 and 50 will invert signal $V_S$ so as to produce output Vout.

The enable signals EN and $\overline{EN}$ will also operate to turn off transistors 52 and 58 of the second inverter when the level detection circuit is in the active mode thereby causing the inverter output at the junction of transistors 54 and 56 to be in a high impedance state. Thus, the output of the second inverter will not interfere with the operation of level detection stage 28A.

When, for example, the integrated circuit of which the subject level detection circuit is a part is to be placed in a standby mode, signal EN will go inactive (low) and signal $\overline{EN}$ will go high. This will cause transistors 30 and 40 to turn off thereby interrupting current flow through the level detection stage 28A. At the same time, transistors 52 and 58 are turned on by signals EN and $\overline{EN}$, respectively, so that the second inverter circuit can become operative. The first inverter circuit will remain operative so that the two inverter circuits will form a latch, holding the state of $V_S$ at the same level which existed just prior to entry into the standby mode. In particular, the bias voltages of feedback transistors 42 and 46, including the gate-source voltage and the drain-source voltage, are maintained even in the standby mode. When the level detector circuit 28 is switched out of the standby mode to the active mode, feedback transistors 42 and 46 will be in the same condition as just prior to entry in the standby mode. As previously noted, the hysteresis is produced as a result of the influence of feedback transistors 42 and 46 on the gate-source voltages of transistors 36 and 34, respectively. Thus, the threshold voltage of the circuit 28 will be either Vin$^+$ or Vin$^-$, depending the condition of the circuit just prior to entry into the standby state.

For one embodiment of the subject invention, the geometry for the various transistors is set forth below in Table 1. The threshold voltage for the N-type transistors is typicaly about +0.75 volts and is typically about −0.90 volts for the P-type transistors. Further, the Beta N to Beta P ratio is approximately two to one.

TABLE 1

| Transistor | W/L | Transistor | W/L |
| --- | --- | --- | --- |
| 30 | 18/1 | 46 | 5/1.5 |
| 32 | 1.5/1 | 48 | 4/1 |
| 34 | 1.5/1 | 50 | 2/1 |
| 36 | 3/1 | 52 | 4/1 |
| 38 | 3/1 | 54 | 4/1 |

TABLE 1-continued

| Transistor | W/L | Transistor | W/L |
|---|---|---|---|
| 40 | 18/1 | 56 | 2/1 |
| 42 | 5/1 | 58 | 2/1 |

An improved level detection circuit having hysteresis and method has been disclosed. Although one embodiment has been described in some detail, it is to be understood that certain changes can be made without departing from the spirit and scope of the invention as defined by the appended claims. By way of example, memory circuits other than latch circuits could be used provided the output of the memory circuit does not interfere with the operation of the level detection stage 28A when the level detection circuit is in the active mode.

I claim:

1. A level detection circuit for producing an output signal indicative of an input signal and switchable between an active mode and a standby mode, said level detection circuit comprising:

a level detection stage having an input for receiving the input signal, said level detection stage having a first threshold voltage when a level detection stage output is at a first state and a second threshold voltage, different from the first threshold voltage, when the level detection stage output is at a second state;

first enable circuitry coupled to the level detection stage for providing a current path through the level detection stage when the level detection circuit is in the active mode and for interrupting the current path when the level detection circuit is in the standby mode; and a storage device configured to store a value which represents the state of the level detection stage output prior to the level detection circuit switching from the active mode to the standby mode and to set the level detection stage output state to one of the first and second states based upon the stored value when the level detection circuit switches from the standby mode to the active mode.

2. The level detection circuit of claim 1 wherein the level detection stage includes a first P-type transistor and a first N-type transistor and wherein a drain of the first N-type transistor is connected to a drain of the first P-type transistor to form the level detection stage output and a gate of the first N-type transistor is connected to a gate of the first P-type transistor to form the level detection stage input.

3. The level detection circuit of claim 2 wherein the storage device includes first and second inverter circuits and second enable circuitry, with an input of the first inverter circuit connected to the level detection stage output and an output of the first inverter circuit connected to an input of the second inverter circuit and an output of the second inverter circuit connected to the input of the first inverter circuit and wherein the second enable circuitry provides a current path through the second inverter circuit when the level detection circuit is in the standby mode and interrupts the current path through the second inverter circuit when the level detection circuit is in the active mode.

4. The level detection circuit of claim 3 wherein the level detection circuit further includes first and second power rails and wherein the first enable circuitry includes a second P-type transistor connected between the first P-type transistor and the first power supply rail and a second N-type transistor connected between the first N-type transistor and the second power supply rail.

5. The level detection circuit of claim 4 wherein the second inverter circuit includes a third P-type transistor and a third N-type transistor connected in series and wherein the second enable circuitry includes a fourth P-type transistor and a fourth N-type transistor, with the fourth P-type transistor connected intermediate the first power supply rail and the third P-type transistor and with the fourth N-type transistor connected intermediate the third N-type transistor and the second power supply rail.

6. A level detection circuit for producing an output signal indicative of an input signal and switchable between an active mode and a standby mode, said level detection circuit comprising:

a level detection stage which includes a first P-type transistor connected is series with a first N-type transistor so as to define a current path, with gates of the first P-type and N-type transistors connected in common to form an input of the level detection stage to receive the input signal and drains connected together to form an output of the level detection stage, and positive feedback circuitry which is connected so that an input threshold voltage of the level detection stage is dependent upon a state of the level detection stage output;

first enable circuitry coupled to the level detection stage for providing a current path through the first P-type and first N-type transistors when the level detection circuit is in the active mode and for interrupting the current path when the level detection circuit is in the standby mode; and a latch circuit configured to store a value which represents the state of the level detection stage output prior to the level detection circuit switching from the active mode to the standby mode and to set level detection stage output state to one of first and second states based upon the stored value when the level detection circuit switches from the standby mode to the active mode.

7. The level detection circuit of claim 6 wherein the latch circuit includes an output section, connected to the level detection stage, which switches to a high impedance state when the level detection circuit is in the active mode.

8. The level detection circuit of claim 7 wherein the output section includes a second P-type transistor and a second N-type transistor connected in series, with a drain of the second P-type transistor connected to a drain of the second N-type transistor to form an output of the latch circuit and wherein the latch circuit further includes second enable circuitry coupled to the output section which provides a second current path through the second P-type and second N-type transistors when the level detection circuit is in the standby mode and which interrupts the second current path when the level detection circuit is in the active mode so that the output section is in the high impedance state.

9. The level detection circuit of claim 8 wherein the positive feedback circuitry includes a third P-type transistor and a third N-type transistor, with the third P-type transistor having a gate connected to the level detection stage output, a drain to be connected to a circuit common and a source connected to a source of the first P-type transistor and with the third N-type transistor having a gate connected to the level detection stage output, a drain connected to a positive voltage relative to the circuit common and a source connected to a source of the first N-type transistor.

10. The level detection circuit of claim 9 wherein the level detection stage further includes a fourth P-type transistor having a drain connected to the source of the first P-type transistor and a fourth N-type transistor having a drain connected to the source of said first N-type transistor, with said fourth P-type and N-type transistors having gates connected to the gates of said first P-type and N-type transistors.

11. The level detection circuit of claim 10 wherein the first enable circuitry includes a fifth P-type transistor connected between a first power supply rail and the fourth P-type transistor and a fifth N-type transistor connected between the fourth N-type transistor and a second power supply rail, wherein the first and second power supply rails correspond to the positive voltage and the circuit common, respectively.

12. The level detection circuit of claim 11 wherein the second enable circuitry includes a sixth P-type transistor connected intermediate the second P-type transistor and the first power supply rail and a sixth N-type transistor connected intermediate the second N-type transistor and the second power supply rail.

13. The level detection circuit of claim 12 wherein the latch circuit further includes an inverter circuit having an output which is connected to an input of the output section and an input connected to the level detection stage output.

14. The level detection circuit of claim 13 wherein the inverter circuit defines a current path which is independent of the level detection circuit mode.

15. A method of controlling a level detection circuit having an input and an output comprising:

applying a signal to the input of the level detection circuit;

setting a threshold voltage of a level detection stage to a first input value if the level detection stage output is in a first state;

setting a threshold voltage of the level detection stage to a second input value, different from the first input value, if the level detection stage output is in a second state, opposite the first state;

switching the level detection circuit from an active mode to a standby mode by interrupting a current path through the level detection stage;

storing an output value which is indicative of the level detection stage output state prior to the step of switching to the standby mode;

switching the level detection circuit from the standby mode to the active mode by restoring the current path through the level detector stage; and after the step of switching to the active mode, setting the level detection stage output to the output state determined by the stored output value.

16. The method of claim 15 wherein the step of storing includes the step of applying a storage circuit input to the level detection circuit output.

17. The method of claim 16 wherein the step of setting the level detection stage output includes the step of applying a storage circuit output to the level detection stage output followed by the step of interrupting a current path of the storage circuit.

* * * * *

UNITED STATES PATENT AND TRADEMARK OFFICE
CERTIFICATE OF CORRECTION

PATENT NO. : PATENT NO.: 6,046,617
DATED : DATED: April 4, 2000
INVENTOR(S) : INVENTOR(S): Wolfgang K. Hoeld It is certified that error appears in the above-identified patent and that said Letters Patent is hereby corrected as shown below:

In column 6, line 34, after "set" insert --the--

In column 7, line 28, "the" should be replaced by --a--.

In column 8, line 15, "detector" should be replaced by --detection--.

Signed and Sealed this

Eighth Day of May, 2001

Attest:

NICHOLAS P. GODICI

Attesting Officer

Acting Director of the United States Patent and Trademark Office